United States Patent
Oh et al.

(10) Patent No.: US 11,955,359 B2
(45) Date of Patent: Apr. 9, 2024

(54) MAGAZINE SUPPORTING EQUIPMENT AND SEMICONDUCTOR MANUFACTURING APPARATUS INCLUDING THE SAME

(71) Applicant: SAMSUNG ELECTRONICS CO., LTD., Suwon-si (KR)

(72) Inventors: Jun Young Oh, Seoul (KR); Seung Hwan Kim, Asan-si (KR); Jong Ho Park, Cheonan-si (KR); Yong Kwan Lee, Hwaseong-si (KR); Jong Ho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 297 days.

(21) Appl. No.: 17/200,981

(22) Filed: Mar. 15, 2021

(65) Prior Publication Data

US 2021/0391199 A1 Dec. 16, 2021

(30) Foreign Application Priority Data

Jun. 10, 2020 (KR) ........................ 10-2020-0070271

(51) Int. Cl.
*H01L 21/673* (2006.01)
*H01L 21/67* (2006.01)
*H01L 21/02* (2006.01)

(52) U.S. Cl.
CPC .... *H01L 21/67383* (2013.01); *H01L 21/6732* (2013.01); *H01L 21/67346* (2013.01);
(Continued)

(58) Field of Classification Search
CPC ......... H01L 21/67383; H01L 21/67379; H01L 21/02; H01L 21/67017;
(Continued)

(56) References Cited

U.S. PATENT DOCUMENTS

| 4,293,249 A | 10/1981 | Whelan |
| 4,457,661 A | 7/1984 | Flint et al. |

(Continued)

FOREIGN PATENT DOCUMENTS

| KR | 10-0164141 | 9/1998 |
| KR | 10-0275135 | 9/2000 |

(Continued)

*Primary Examiner* — Charlee J. C. Bennett
(74) *Attorney, Agent, or Firm* — F. CHAU & ASSOCIATES, LLC

(57) ABSTRACT

The present disclosure provides a magazine supporting equipment for supporting a magazine with multiple input ports. The magazine supporting equipment comprises a contact plate, a first sidewall plate, and a second sidewall plate. The contact plate is in contact with the magazine. The first sidewall plate extends vertically from one end of the contact plate. The second sidewall plate parallel is to the first sidewall plate and extends vertically from one end to the other end of the contact plate. The first sidewall plate extends along at least a part of a first sidewall of the magazine. The second sidewall plate extends along at least a part of a second sidewall of the magazine. The first sidewall plate and the second sidewall plate include control openings through which gas flows in and out.

13 Claims, 16 Drawing Sheets

(52) U.S. Cl.
CPC ........ *H01L 21/67379* (2013.01); *H01L 21/02* (2013.01); *H01L 21/67017* (2013.01)

(58) Field of Classification Search
CPC . H01L 21/673–67346; H01L 21/67757; H01L 21/67769; H05K 13/0084
USPC .................................................. 156/345.51
See application file for complete search history.

(56) References Cited

U.S. PATENT DOCUMENTS

| | | | |
|---|---|---|---|
| 6,034,000 A * | 3/2000 | Heyder | H01L 21/67781 438/758 |
| 6,267,075 B1 * | 7/2001 | Moffat | B08B 7/0035 204/298.37 |
| 6,792,889 B2 | 9/2004 | Nakano et al. | |
| 2004/0170003 A1 * | 9/2004 | Chen | H01L 21/67386 361/741 |
| 2004/0211516 A1 * | 10/2004 | Rigali | H01L 21/67778 156/345.31 |
| 2005/0011055 A1 * | 1/2005 | Bradley | H05K 13/0084 24/570 |
| 2012/0260945 A1 * | 10/2012 | Kim | H01L 21/67028 134/18 |
| 2021/0028047 A1 * | 1/2021 | Na | H01L 33/62 |
| 2021/0267104 A1 * | 8/2021 | Lehner | H05K 13/0061 |
| 2023/0018842 A1 * | 1/2023 | Jiangang | H01L 21/67323 |

FOREIGN PATENT DOCUMENTS

| | | |
|---|---|---|
| KR | 20-0243280 | 8/2001 |
| KR | 20-0418767 | 6/2006 |
| KR | 10-0669661 | 1/2007 |
| KR | 10-0851242 | 8/2008 |
| KR | 10-1887461 | 8/2018 |
| WO | 2009078503 | 6/2009 |

* cited by examiner

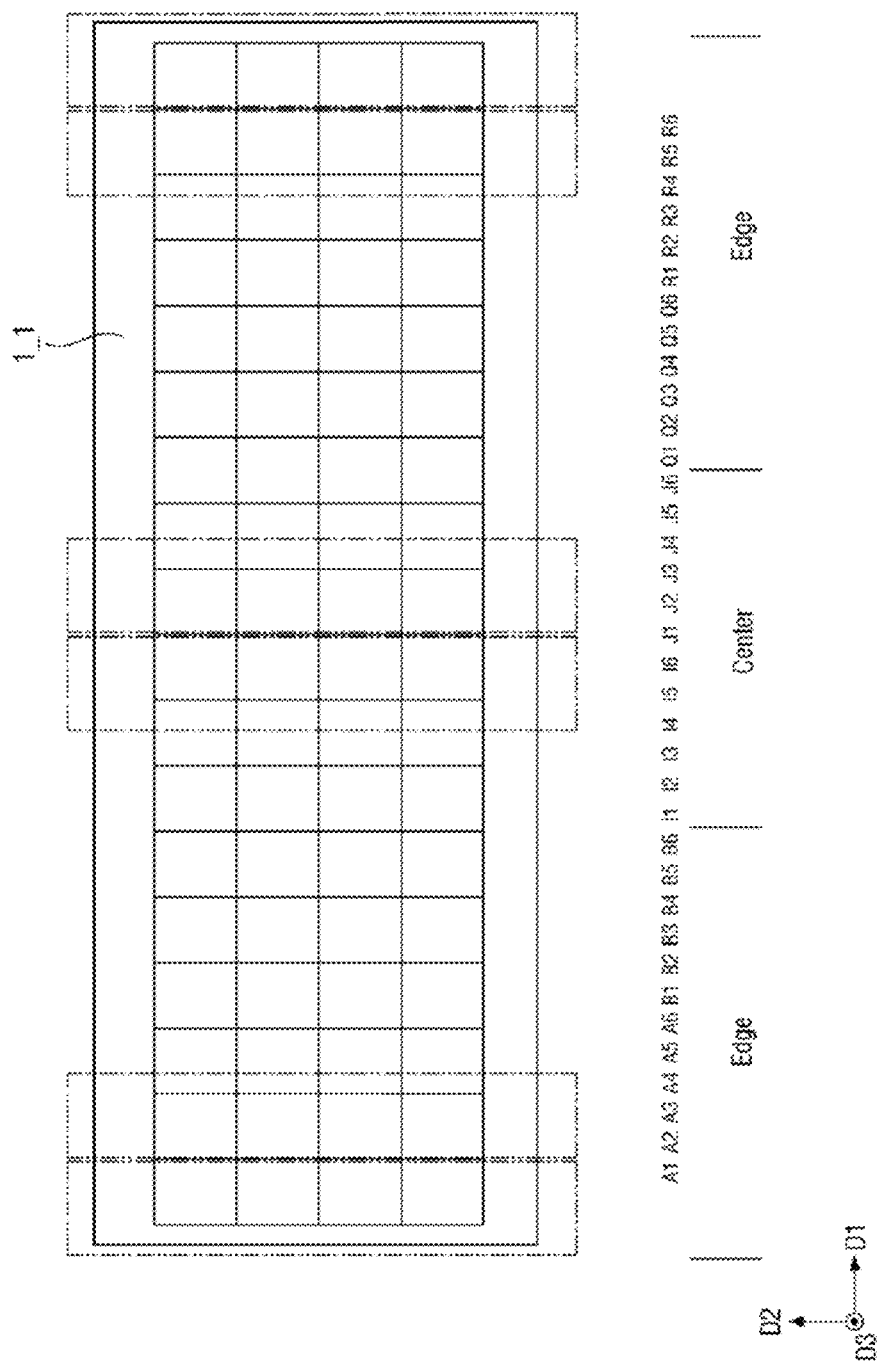

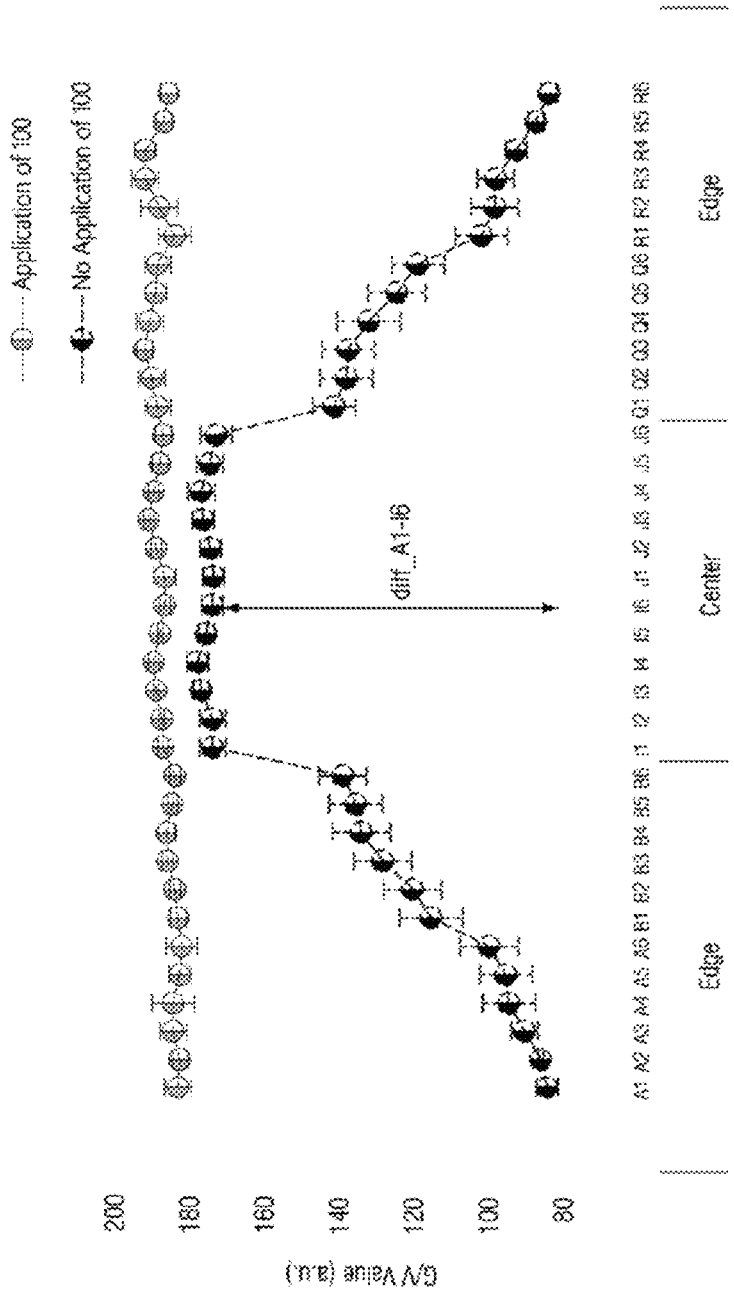

MAGAZINE SUPPORTING EQUIPMENT AND SEMICONDUCTOR MANUFACTURING APPARATUS INCLUDING THE SAME

CROSS-REFERENCE TO RELATED APPLICATION

This application claims priority from Korean Patent Application No. 10-2020-0070271 filed on Jun. 10, 2020 in the Korean Intellectual Property Office, and all the benefits accruing therefrom under 35 U.S.C. 119, the contents of which are incorporated by reference herein in their entirety.

BACKGROUND

1. Technical Field

The present disclosure relates to a magazine supporting equipment and a semiconductor manufacturing apparatus including the same.

2. Description of the Related Art

A semiconductor is a material with conductivity between a conductor and an insulator. Semiconductor materials are used in semiconductor devices, which may include circuits in an electronic device. Semiconductors are often manufactured in various stages, and in some cases a packaging stage is the final manufacturing stage.

A semiconductor packaging process may include mounting several kinds of semiconductor packages or semiconductor chips on a substrate known as a strip member. In some cases, the strip member may be cleaned and treated prior to the semiconductor packaging process. For example, a plasma process may be performed on a strip member to clean the surfaces of the semiconductor. During the cleaning, a magazine may be used to hold semiconductor chip or strip members in a vertical orientation.

However, an asymmetric structure of openings of the magazine may prevent a uniform plasma process, which reduces the reliability and efficiency of the semiconductor packaging process. Therefore, there is a need in the art to provide a uniform plasma cleaning process to semiconductors prior to packaging.

SUMMARY

Aspects of the present disclosure provide a magazine supporting equipment that is capable of mitigating process non-uniformity caused by an asymmetric structure of a magazine. Aspects of the present disclosure also provide a semiconductor manufacturing apparatus that is capable of mitigating process non-uniformity caused by an asymmetric structure of a magazine.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the present disclosure, there is provided a magazine supporting equipment, comprising a contact plate in contact with a magazine that includes a plurality of input ports; a first sidewall plate extending vertically from a first end of the contact plate; and a second sidewall plate disposed parallel to the first sidewall plate, and extending vertically from a second end of the contact plate opposite the first end, wherein the first sidewall plate extends vertically along at least a part of a first sidewall of the magazine, the second sidewall plate extends vertically along at least a part of a second sidewall of the magazine, the first sidewall plate and the second sidewall plate each include a plurality of control openings configured to enable gas to flow in and out of the magazine.

According to the aforementioned and other embodiment of the present disclosure, there is provided a semiconductor manufacturing apparatus comprising a magazine including N input ports, a magazine supporting equipment configured to support the magazine and a gas injection part configured to inject etching gas into the magazine and the magazine supporting equipment, wherein the magazine supporting equipment includes a contact plate in contact with the magazine, a first sidewall plate extending vertically from one end of the contact plate and a second sidewall plate parallel to the first sidewall plate, and extending vertically from the other end of the contact plate, wherein the first sidewall plate extends along at least a part of a first sidewall of the magazine, the second sidewall plate extends along at least a part of a second sidewall of the magazine, the first sidewall plate and the second sidewall plate include control openings through which gas flows in and out, and the N is a natural number of 2 or more.

According to the aforementioned and other embodiment of the present disclosure, there is provided a semiconductor manufacturing apparatus comprising a magazine including N input ports and an empty space under a bottom-most input port among the N input ports, a magazine supporting equipment configured to support the magazine and a gas injection part configured to inject an etching gas into the magazine and the magazine supporting equipment, wherein the magazine supporting equipment includes a contact plate in contact with the magazine, a first sidewall plate extending vertically from one end of the contact plate and a second sidewall plate parallel to the first sidewall plate, and extending vertically from the other end of the contact plate, wherein the first sidewall plate extends along at least a part of a first sidewall of the magazine, the second sidewall plate extends along at least a part of a second sidewall of the magazine, the first sidewall plate and the second sidewall plate include N+1 control openings through which the etching gas flows in and out, and the N is a natural number of 2 or more.

BRIEF DESCRIPTION OF THE DRAWINGS

The above and other aspects and features of the present disclosure will become more apparent by describing in detail exemplary embodiments thereof with reference to the attached drawings, in which:

FIGS. 15 and 16 are diagrams for explaining effects of a semiconductor manufacturing apparatus according to some embodiments of the present disclosure.

DETAILED DESCRIPTION

The present disclosure relates generally to a magazine supporting equipment for semiconductor production. Embodiments of the present disclosure openings in the magazine supporting equipment that enable gases to flow in and out of the magazine supporting system.

For example, some embodiments include holes, slots, or openings on the sides of a semiconductor magazine loader to provide a path for gasses to enter and escape during a cleaning process.

A cleaning process may be performed on semiconductor disks prior to a packaging process. The cleaning process may use plasmatized gases to treat the surface of the semiconductors. However, conventional magazine supporting systems do not include means for ensuring that the plasmatized gas is uniform. If the plasmatized gas inside the magazine supporting system is not uniform, semiconductor materials may be damaged or insufficiently cleaned, and the reliability and efficiency of the cleaning may be reduced.

An example magazine supporting equipment of the present disclosure comprises a contact plate, a first sidewall plate, and a second sidewall plate. The contact plate is in contact with a magazine. According to embodiments of the present disclosure, the magazine may be configured to hold semiconductor chips, members, or other components of a semiconductor manufacturing process at a certain orientation (i.e., to ensure that the components held by the magazine remain in a horizontal or vertical position during a portion of a manufacturing process.

The first sidewall plate extends vertically from one end of the contact plate. The second sidewall plate parallel is to the first sidewall plate and extends vertically from one end to the other end of the contact plate. The first sidewall plate extends along at least a part of a first sidewall of the magazine. The second sidewall plate extends along at least a part of a second sidewall of the magazine. The first sidewall plate and the second sidewall plate include control openings through which gas flows in and out. The N is a natural number of 2 or more.

Hereinafter, exemplary embodiments of the present disclosure will be described with reference to the accompanying drawings. The same reference numbers are used throughout FIGS. 1 to 16 to refer to the same components, and in some cases redundant descriptions of the corresponding components are omitted.

Figure 1:
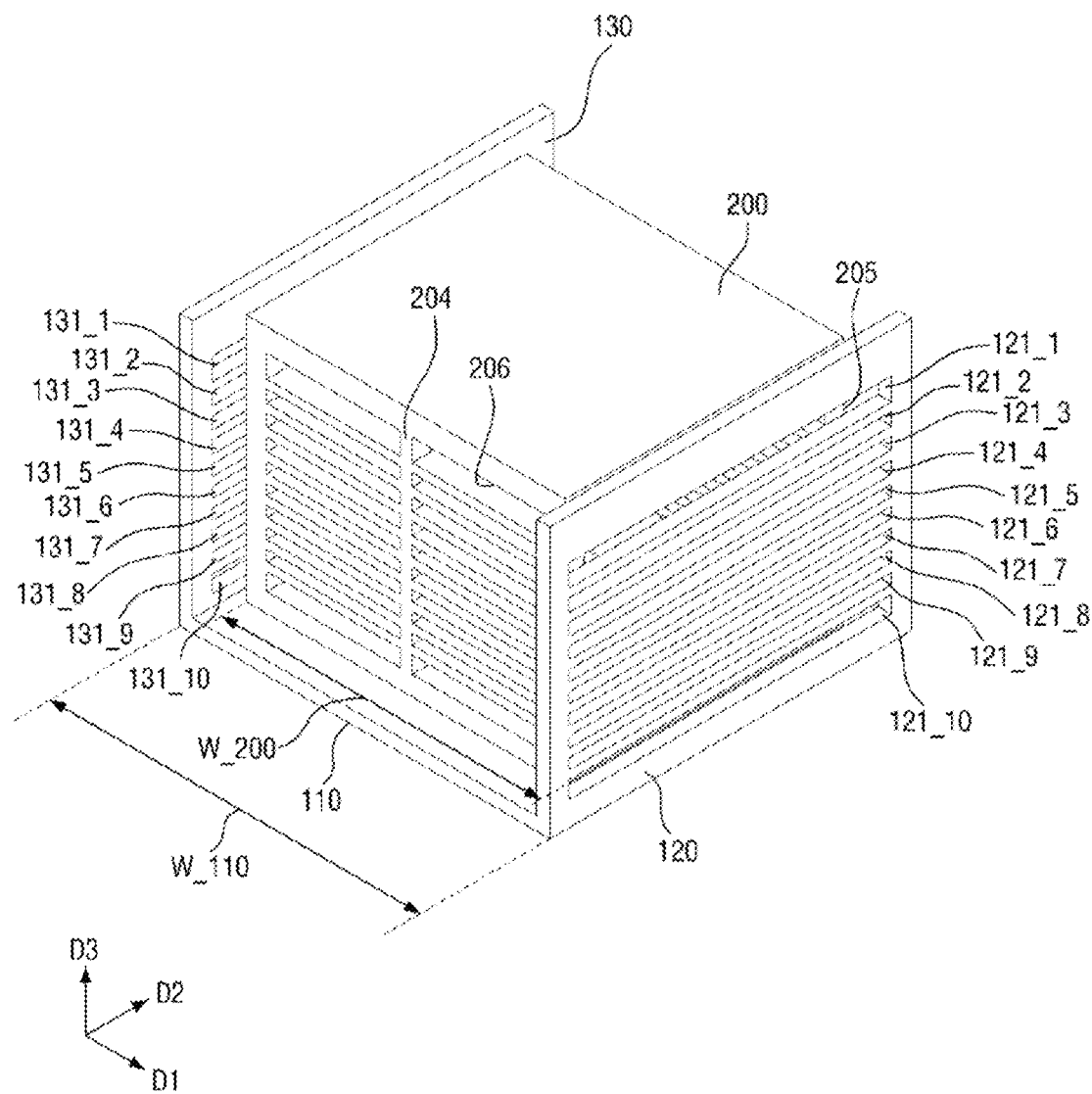
FIG. 1 is a perspective view illustrating a magazine and a magazine supporting equipment according to some embodiments of the present disclosure.
Figure 2:
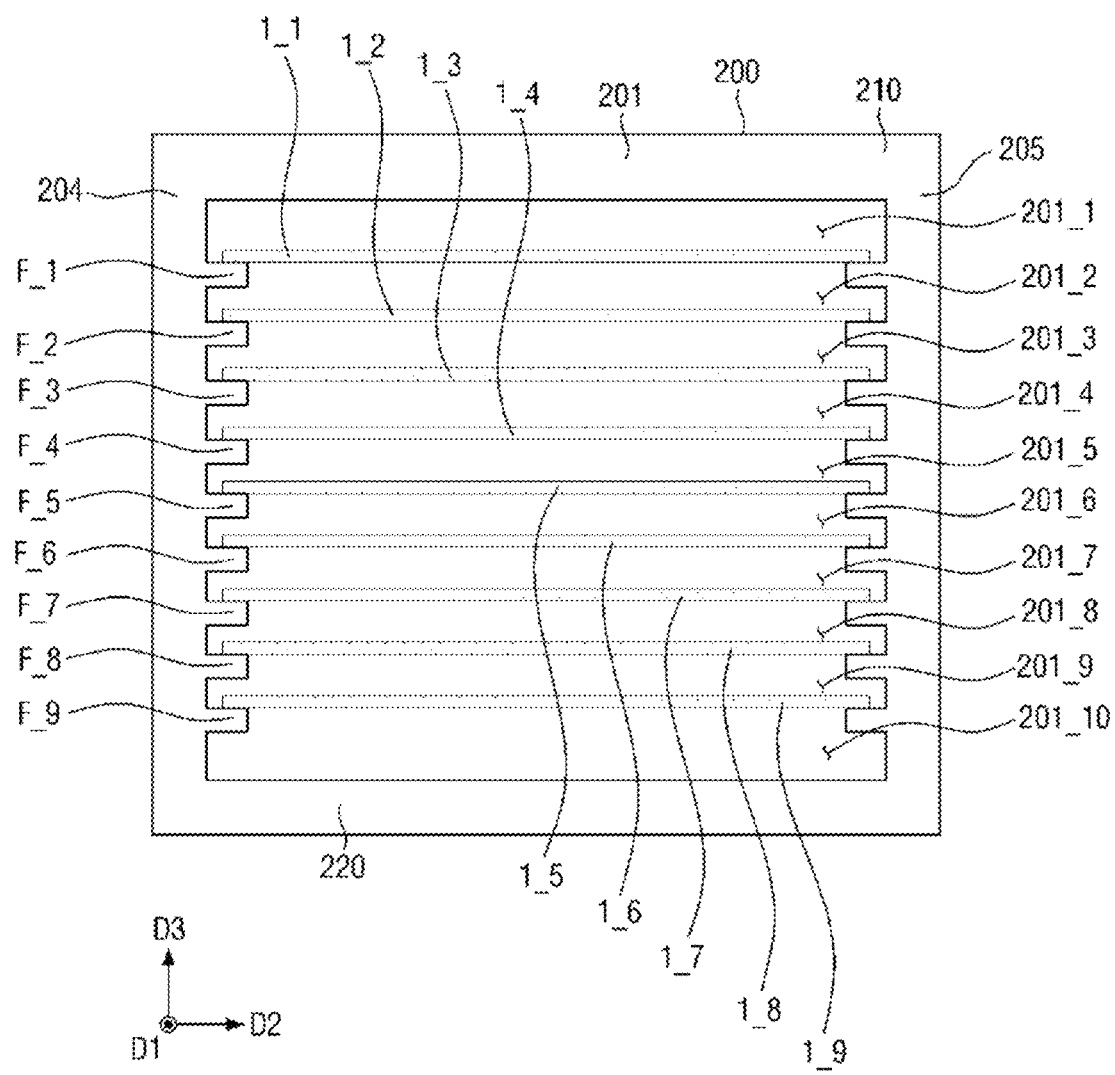
FIG. 2 is a plan view illustrating a magazine according to some embodiments of the present disclosure.
Figure 3:
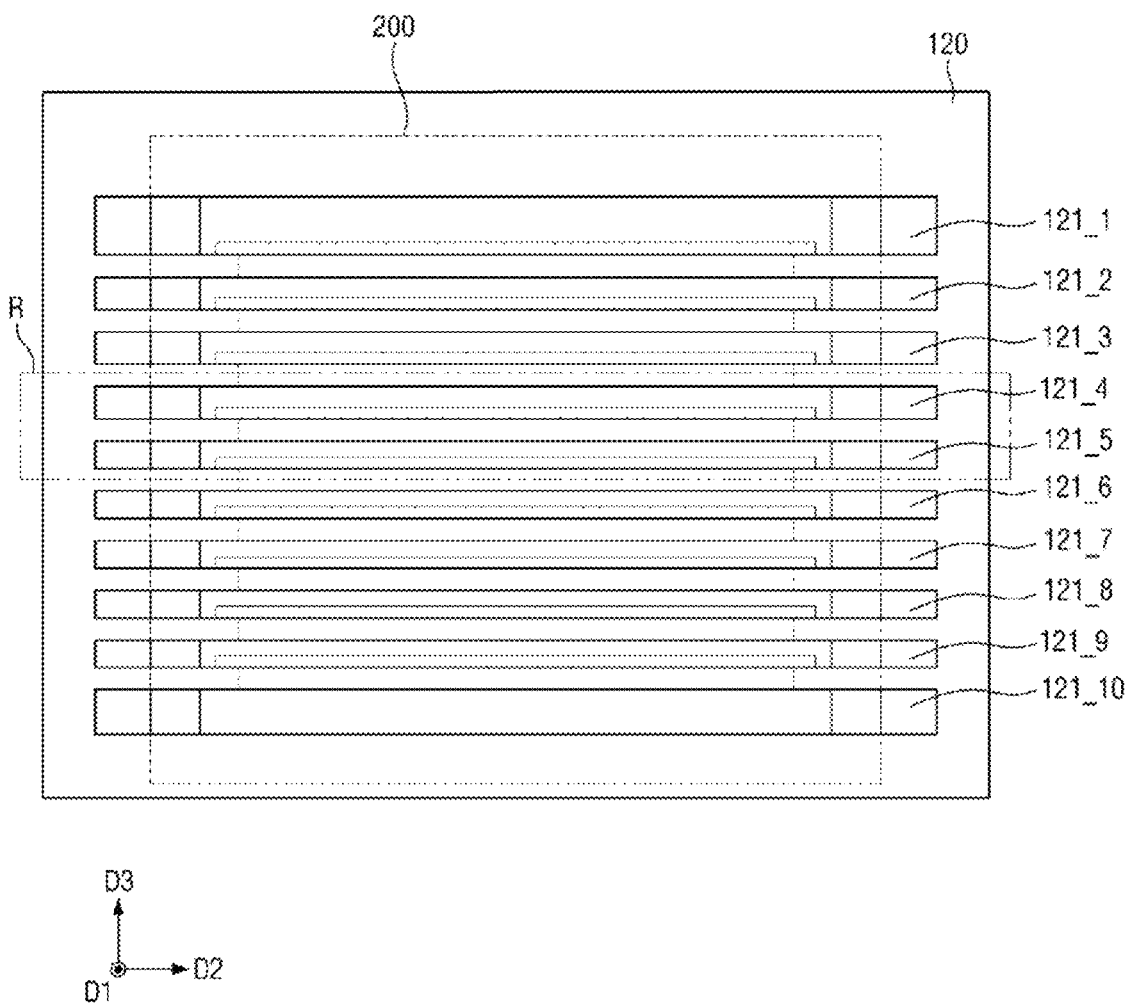
FIG. 3 is a plan view illustrating a magazine and a magazine supporting equipment according to some embodiments of the present disclosure.
Figure 4:
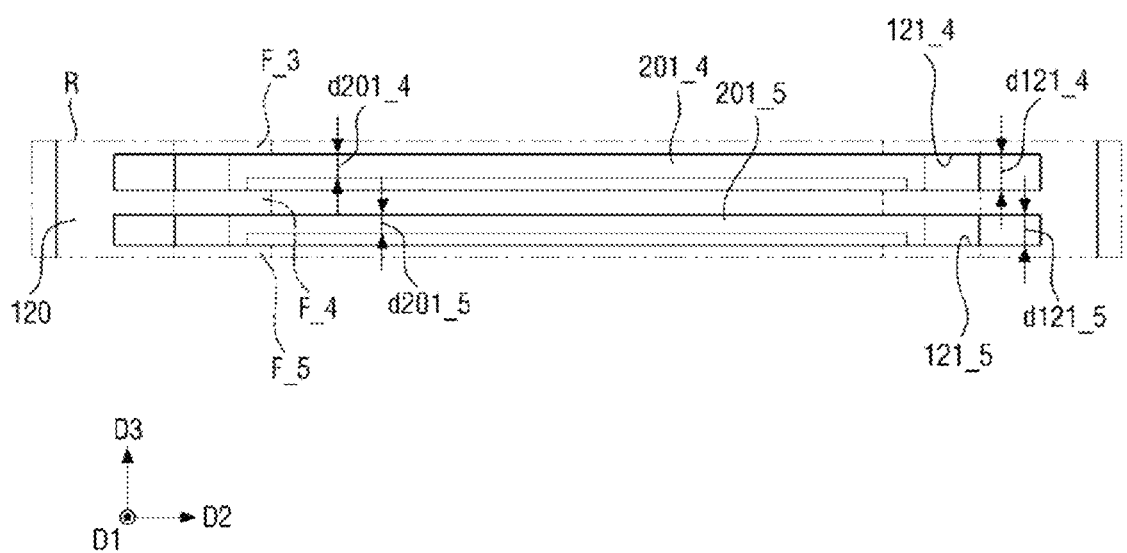
FIG. 4 is an enlarged view illustrating part R of FIG. 3.

FIG. 1 is a perspective view illustrating a magazine and a magazine supporting equipment according to some embodiments of the present disclosure. FIG. 2 is a plan view illustrating a magazine according to some embodiments of the present disclosure. FIG. 3 is a plan view illustrating a magazine and a magazine supporting equipment according to some embodiments of the present disclosure. FIG. 4 is an enlarged view illustrating part R of FIG. 3.

Referring to FIGS. 1 to 4, a magazine supporting equipment 100 according to some embodiments of the present disclosure may include a contact plate 110, a first sidewall plate 120, and a second sidewall plate 130.

The contact plate 110 may contact a bottom wall 220 of a magazine 200, and extend a first distance $W\_110$ along a first direction D1. The first distance $W\_110$ may be greater than a magazine width $W\_200$ of the magazine 200. Accordingly, in the case where the difference between the first distance $W\_110$ and the magazine width $W\_200$ is greater than the sum of the thicknesses of the first and second sidewall plates 120 and 130, the first and second sidewall plates 120 and 130 may not contact first and second sidewalls 201 and 202 of the magazine 200, respectively.

As will be described later with reference to FIG. 10, a rotation member 160 (see FIG. 10) may be attached to the bottom of the contact plate 110 in a third direction D3, and the rotation member 160 (see FIG. 10) may support the magazine supporting equipment 100 and the magazine 200.

Although it is illustrated that the contact plate 110 contacts the bottom wall 220 of the magazine 200, according to an embodiment, the contact plate 110 may be arranged on a top wall 210 of the magazine 200 in the third direction D3. As such, the contact plate 110 may contact the top wall 210 such that the rotation member 160 (see FIG. 10) may be arranged above the contact plate 110 in the third direction D3. In this case, the first and second sidewall plates 120 and 130 may contact the respective first and second sidewalls 201 and 202 of the magazine 200.

The first sidewall plate 120 may extend along one end of the contact plate 110 in the third direction D3. According to an embodiment, the first sidewall plate 120 may extend to the top of the top wall 210 of the magazine 200 to entirely cover the entire first sidewall 201 of the magazine 200 to hide the entire first sidewall 201 of the magazine 200 in D2-D3 plan view. According to the present disclosure, the term "entirely cover" means that the first sidewall plate 120 may extend both vertically and horizontally (i.e., in the directions D3 and D2) at least as far as the first sidewall 201 (both up and down and side to side).

The first sidewall plate 120 includes multiple control openings. For example, in an embodiment, the first sidewall plate 120 includes first to tenth control openings $121\_1$ to $121\_10$. The first to tenth control openings $121\_1$ to $121\_10$ may each have a rectangular shape elongated in the second direction D2. However, the first to tenth control openings $121\_1$ to $121\_10$ may have a circular or polygonal shape depending on the embodiment, and the present disclosure is not limited thereto. Descriptions of the vertical interval and arrangement of the first to tenth control openings $121\_1$ to $121\_10$ are made later, along with the description of the magazine 200.

The first control opening $121\_1$ may be arranged at the highest position from the contact plate 110 in the third direction D3. The tenth control opening $121\_10$ may be arranged at the lowest position from the contact plate 110 in the third direction D3. The first to tenth control openings 121_1 to 121_10 may be vertically arranged in the order from the first control opening 121_1 to the tenth control opening 121_10. The first to tenth control openings 121_1 to 121_10 may have the same width in the second direction D2.

The second sidewall plate 130 may extend along the other end of the contact plate 110 in the third direction D3 to the top of the top wall 210 of the magazine 200 to cover the entire second sidewall 202 to hide the entire second sidewall 202 in D2-D3 plan view.

The second sidewall plate 130 may include first to tenth control openings 131_1 to 131_10. The first to tenth control openings 131_1 to 131_10 of the second sidewall plate 130 may respectively correspond to the first to tenth control openings 121_1 to 121_10 of the first sidewall plate 120. Additionally, or alternatively, the first to tenth control openings 131_1 to 131_10 of the second sidewall plate 130 may be arranged in a symmetrical manner around the contact plate 110. Therefore, the descriptions of the first to tenth control openings 131_1 to 131_10 of the second sidewall plate 130 may be replaced by those of the first to tenth control openings 121_1 to 121_10 of the first sidewall plate 120.

The first to tenth control openings 121_1 to 121_10 may serve as an inlet/outlet for gas, which may flow into the magazine 200. By allowing gas to flow through the control openings (and thereby in and out of the magazine 200), embodiments of the present disclosure may enable improved control of the gas used during a cleaning or treatment process such as a plasma process. For example, a plasma gas used during a plasma process may be distributed more evenly throughout the magazine, thereby improving the reliability and efficiency of the manufacturing process compared to techniques that use a conventional magazine.

The contact plate 110 and the first and second sidewall plates 120 and 130 of the magazine supporting equipment 100 may include a flame resistant and insulating material so as not to be etched by a plasmatized process gas (e.g., plasmatized $O_2$ gas).

According to some embodiments of the present disclosure, the magazine 200 may have a cuboid shape and include a first sidewall 201, a second sidewall 202, a third sidewall 204, a fourth sidewall 205, a top wall 210, and a bottom wall 220.

The bottom wall 220 of the magazine 200 may contact the contact plate 110 of the magazine supporting equipment 100. The first and second sidewalls 201 and 202 may extend from the bottom wall 220 in the third direction D3, facing the respective first and second sidewall plates 120 and 130 of the magazine supporting equipment 100.

The third and fourth sidewalls 204 and 205 may be arranged between the first and second sidewalls 201 and 202 to face each other while being spaced apart.

The first and second sidewalls 201 and 202 may include first to ninth input ports 201_1 to 201_9 and a bottom space 201_10.

The first to ninth input ports 201_1 to 201_9 and the bottom space 201_10 may be formed by first to ninth protrusions F_1 to F_9 extending in the first direction D1 along the third and fourth sidewalls 204 and 205 and arranged vertically in the order from the first protrusion F_1 as the top-most one to the ninth protrusion F_9 as the bottom-most one regarding the bottom wall 220.

The first input port 201_1 is a space surrounded by the top wall 210, the first protrusion F_1, and the third and fourth sidewalls 204 and 205. The second input port 201_2 is a space surrounded by the first and second protrusions F_1 and F_2 and the third and fourth sidewalls 204 and 205. Likewise, the third to ninth input ports 201_3 to 201_9 are spaces corresponding to the second input port 201_2 and surrounded by corresponding protrusions and the third and fourth sidewalls 204 and 205.

The bottom space 201_10 is a space surrounded by the ninth protrusion F_9, the bottom wall 220, and the third and fourth sidewalls 204 and 205. According to an embodiment, the first to ninth input ports 201_1 to 201_9 and the bottom space 201_10 may be connected to form a single open space and structured such that the strip members, with substrates, are carried in and out through the first to ninth input ports 201_1 to 201_9.

The first input port 201_1 may be arranged at the top-most height in the third direction D3. The bottom space 201_10 may be arranged at the bottom-most height in the third direction D3, by the vertical arrangement of the first to ninth protrusions F_1 to F_9. The first to ninth input ports 201_1 to 201_9 and the bottom space 201_10 may be vertically arranged in the order from the first input port 201_1 to the bottom space 201_10. The first to ninth input ports 201_1 to 201_9 and the bottom space 201_10 may be equal in width in the second direction D2.

First to ninth substrates 1_1 to 1_9 may be respectively inserted into the first to ninth input ports 201_1 to 201_9, and placed on the respective first to ninth protrusions F_1 to F_9.

The first to ninth input ports 201_1 to 201_9 may be in a vertical arrangement. The substrates may be vertically arranged in the order from the first substrate 1_1 farthest from the bottom wall 220 to the ninth substrate 1_9 closest to the bottom wall 220 to be overlapped in D1-D3 plan view. The first to ninth substrates 1_1 to 1_9 may be a silicon substrate, a circuit film, a lead frame, or the like, or may refer to a printed circuit board (PCB) itself or a semiconductor package obtained by bonding semiconductor chips and wirings on the substrate, but the present disclosure is not limited thereto.

Referring to FIG. 3, the first to ninth input ports 201_1 to 201_9 and the bottom space 201_10 may respectively correspond to the first to tenth control openings 121_1 to 121_10 of the magazine supporting equipment 100.

Referring to FIG. 4, according to an embodiment, a distance d201_4 between the third and fourth protrusions F_3 and F_4, may be equal to the vertical width of the fourth input port 201_4. A distance d201_5 between the fourth and fifth protrusions F_4 and F_5, may be equal to the vertical width of the fifth input port 201_5. Accordingly, the distance d201_4 between the third and fourth protrusions F_3 and F_4 and the distance d201_5 between the fourth and fifth protrusions F_4 and F_5 may differ from each other.

The distance d201_4 between the third and fourth protrusions F_3 and F_4 may be greater than the distance d201_5 between the fourth and fifth protrusions F_4 and F_5. However, according to an embodiment, the first to ninth input ports 201_1 to 201_9 and the bottom space 201_10 may be equal in vertical width to one another.

The distance d201_4 between the third and fourth protrusions F_3 and F_4 may be equal to a vertical width d121_4 of the fourth control opening 121_4, and the distance d201_5 between the fourth and fifth protrusions F_4 and F_5 may be equal to a vertical width d121_5 of the fifth control opening 121_5.

Accordingly, the first to tenth control openings 121_1 to 121_10 may respectively overlap the first to ninth input ports 201_1 to 201_9 and the bottom space 201_10 in D2-D3 plan view.

The third and fourth sidewalls 204 and 205 may include the first to ninth protrusions F_1 to F_9. Between the first to ninth protrusions F_1 to F_9, a plurality of first openings 206 may be arranged on the third sidewall 204, and a plurality of second openings 207 may be arranged on the fourth sidewall 205. The gas may flow to the substrates through the first and second openings 206 and 207.

The magazine 200 may include a flame resistant and insulating material to not be etched by the plasmatized process gas (e.g., plasmatized $O_2$ gas).

Although not shown in the drawing, a ventilation hole may be formed on the top wall 210 and the bottom wall 220 for air ventilation or heat dissipation in storing or transferring the strip members.

Further, although not shown in the drawing, a knob for use in storing and transferring the magazine 200 may be arranged on the top wall 210.

Although shown in the drawing that the magazine 200 is provided with the first to ninth input ports 201_1 to 201_9, the magazine 200 may be provided with the first to $N^{th}$ input ports, but the present disclosure is not limited thereto. In this case, the first and second sidewall plates 120 and 130 may each be provided with the first to $(N+1)^{th}$ control openings. Likewise, the first to $N^{th}$ input ports and the bottom space may correspond to the first to $(N+1)^{th}$ control openings and may be overlapped in a plan view.

Figure 5:
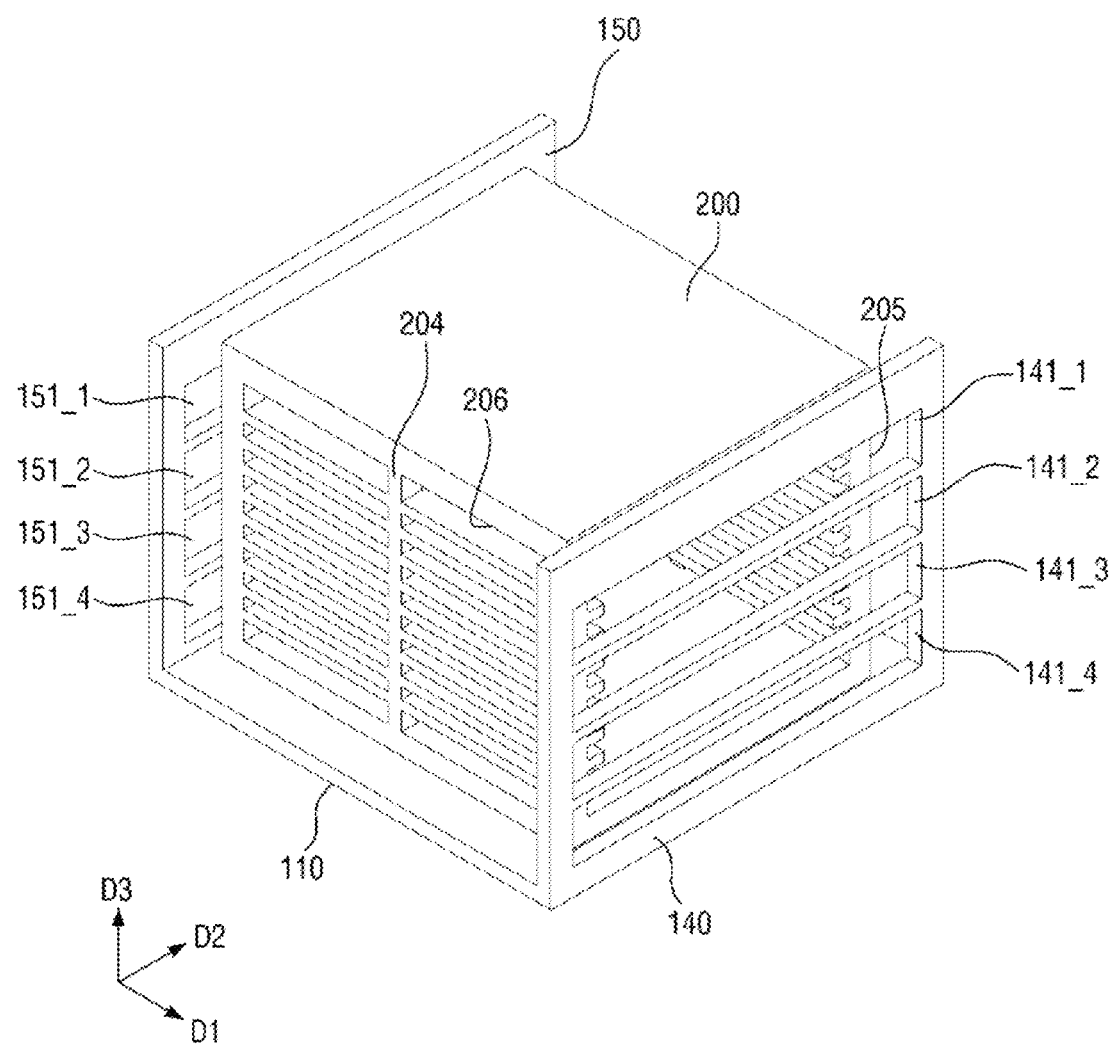
FIG. 5 is a perspective view illustrating a magazine supporting equipment according to some other embodiments of the present disclosure.
Figure 6:
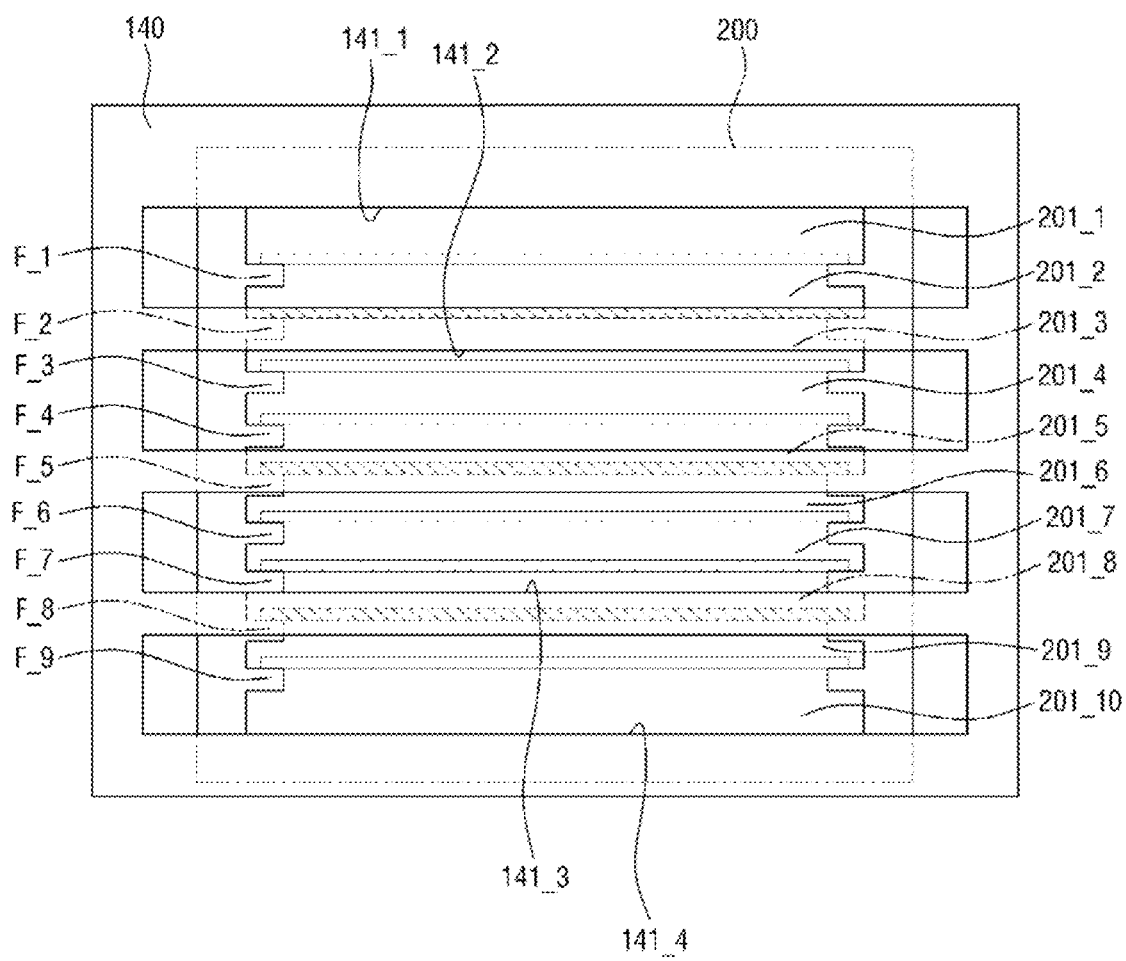
FIG. 6 is a plan view illustrating a magazine supporting equipment according to some other embodiments of the present disclosure.

FIG. 5 is a perspective view illustrating a magazine supporting equipment according to some other embodiments of the present disclosure. FIG. 6 is a plan view illustrating a magazine supporting equipment according to some other embodiments of the present disclosure.

Hereinafter, a description is made of the magazine supporting equipment according to some other embodiments of the present disclosure with reference to FIGS. 5 and 6. The following description is mainly directed to the differences from the magazine supporting equipment shown in FIGS. 1 to 4.

Referring to FIGS. 5 and 6, the magazine supporting equipment 100 may include a first sidewall plate 140 and a second sidewall plate 150.

The first sidewall plate 140 may extend in the third direction D3 along one end of the contact plate 110. According to an embodiment, the first sidewall plate 140 may extend to be higher than the top wall 210 of the magazine 200.

The first sidewall plate 140 may include first to fourth control openings 141_1 to 141_4. The first to fourth control openings 141_1 to 141_4 may each have a rectangular shape elongated in the second direction D2. However, the first to fourth control openings 141_1 to 141_4 may have a circular or polygonal shape depending on the embodiment, but the present disclosure is not limited thereto.

The first control opening 141_1 may be arranged at the highest position from the contact plate 110 in the third direction D3, and the fourth control opening 141_4 may be arranged at the lowest position from the contact plate 110 in the third direction D3. The first to fourth control openings 141_1 to 141_4 may be arranged vertically from the first control opening 141_1 to the fourth control opening 141_4. The first to fourth control openings 141_1 to 141_4 may have the same width in the second direction D2.

The second sidewall plate 150 may extend along the other end of the contact plate 110 in the third direction D3 to be higher than the top wall 210 of the magazine 200.

The second sidewall plate 150 includes first to fourth control openings 151_1 to 151_4.

The first to fourth control openings 151_1 to 151_4 of the second sidewall plate 150 may respectively correspond to the first to fourth control openings 141_1 to 141_4 of the first sidewall plate 140, and may be arranged in a symmetrical manner around the contact plate 110. Therefore, the descriptions of the first to fourth control openings 151_1 to 151_4 of the second sidewall plate 150 may be replaced by those of the first to fourth control openings 141_1 to 141_4 of the first sidewall plate 140.

The first control opening 141_1 of the first sidewall plate 140 may overlap a part of the first input port 201_1 and a part of the second input port 201_2 of the magazine 200 in D2-D3 plan view.

The second control opening 141_2 of the first sidewall plate 140 may overlap a part of the third input port 201_3 and the fourth and fifth input ports 201_4 and 201_5 in D2-D3 plan view.

The third control opening 141_3 of the first sidewall plate 140 may overlap the sixth and seventh input ports 201_6 and 201_7 in D2-D3 plan view.

The fourth control opening 141_4 of the first sidewall plate 140 may overlap the ninth input port 201_9 and the bottom space 201_10 in D2-D3 plan view.

Although shown in the drawing that the first and second sidewall plates 140 and 150 are provided with the first to fourth control openings 141_1 to 141_4 and 151_1 to 151_4, the first and second sidewall plates 140 and 150 may each be provided with M control openings, where M is a natural number, butt the present disclosure is not limited thereto, In the case where the magazine 200 is provided with the first to $N^{th}$ input ports, the first and second sidewall plates 140 and 150 may be provided with the first to $M^{th}$ control openings. Here, M may or may not be equal to N.

According to an embodiment of the present disclosure, the control openings may vary in number, size, and arrangement to adjust the amount of the gas flowing in through the control openings during the process.

Figure 7:
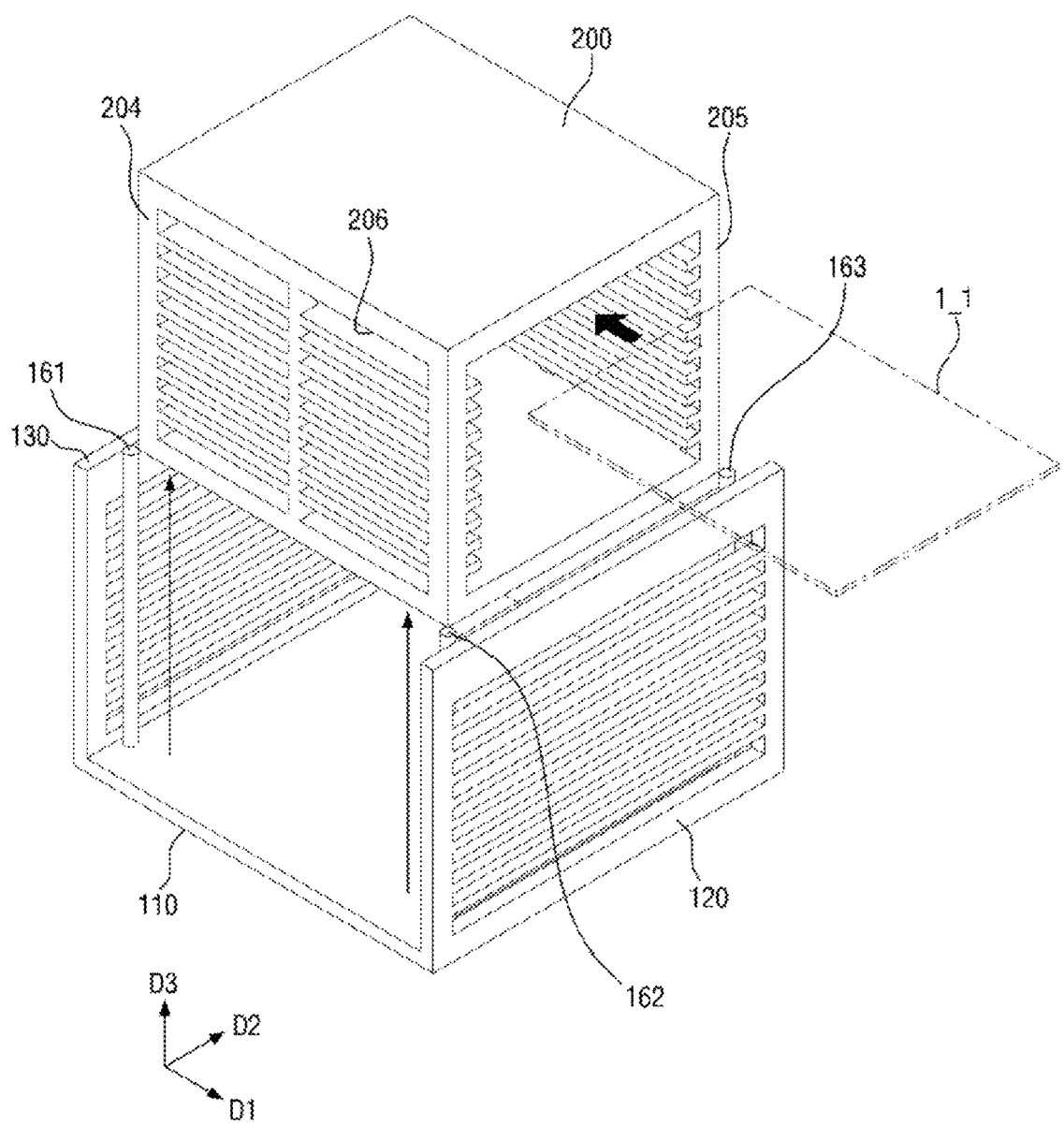
FIG. 7 is a perspective view illustrating a magazine and a magazine supporting equipment according to some other embodiments of the present disclosure.

FIG. 7 is a perspective view illustrating a magazine and a magazine supporting equipment according to some other embodiments of the present disclosure. Hereinafter, a description is made of the magazine supporting equipment according to some other embodiments according to the present disclosure with reference to FIG. 7. The following description is mainly directed to the differences from the magazines and magazine supporting equipment shown in FIGS. 1 to 4.

The magazine supporting equipment 100 may further include first to fourth lifting members 161 to 164 (164 is not shown) that adjacently contact the first to fourth sidewalls 201, 202, 204, and 205 of the magazine 200.

The magazine supporting equipment 100 may be mechanically connected to the magazine 200 via the first to fourth lifting members 161 to 164, and the first to fourth lifting members 161 to 164 may lift the magazine 200 from the contact plate 110 in the third direction D3.

According to an embodiment, the first to fourth lifting members 161 to 164 may include rollers including bearings, or plates including grooves therein to slidably move the magazine 200 in the third direction D3.

The configuration of the first to fourth lifting members 161 and 164 is merely an exemplary embodiment of lifting the magazine 200, and the present disclosure is not limited to thereto.

According to some embodiments of the present disclosure, carrying in and out a strip member with the first substrate 1_1 via the lifted magazine 200 may be possible.

Figure 8:
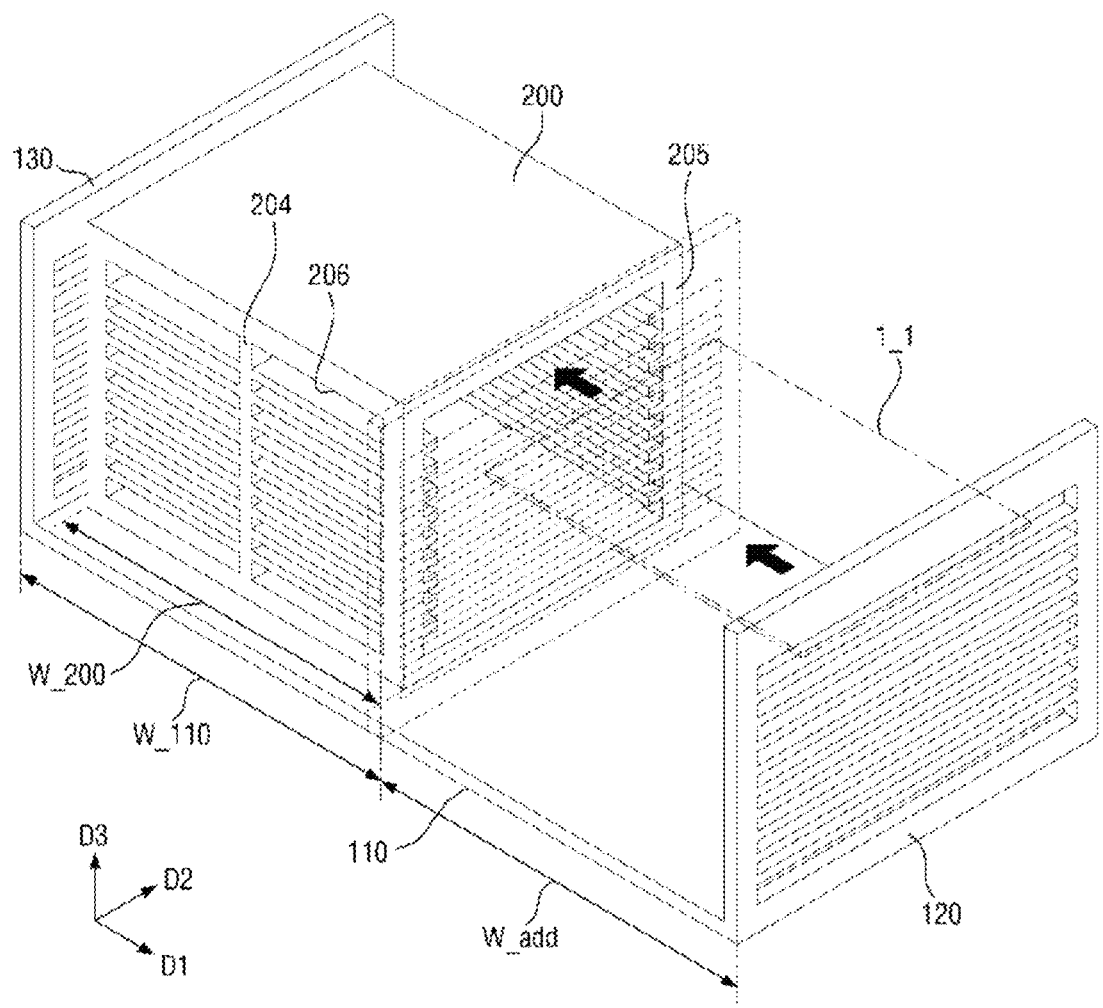
FIG. 8 is a perspective view illustrating a magazine and a magazine supporting equipment according to some other embodiments of the present disclosure.
Figure 9:
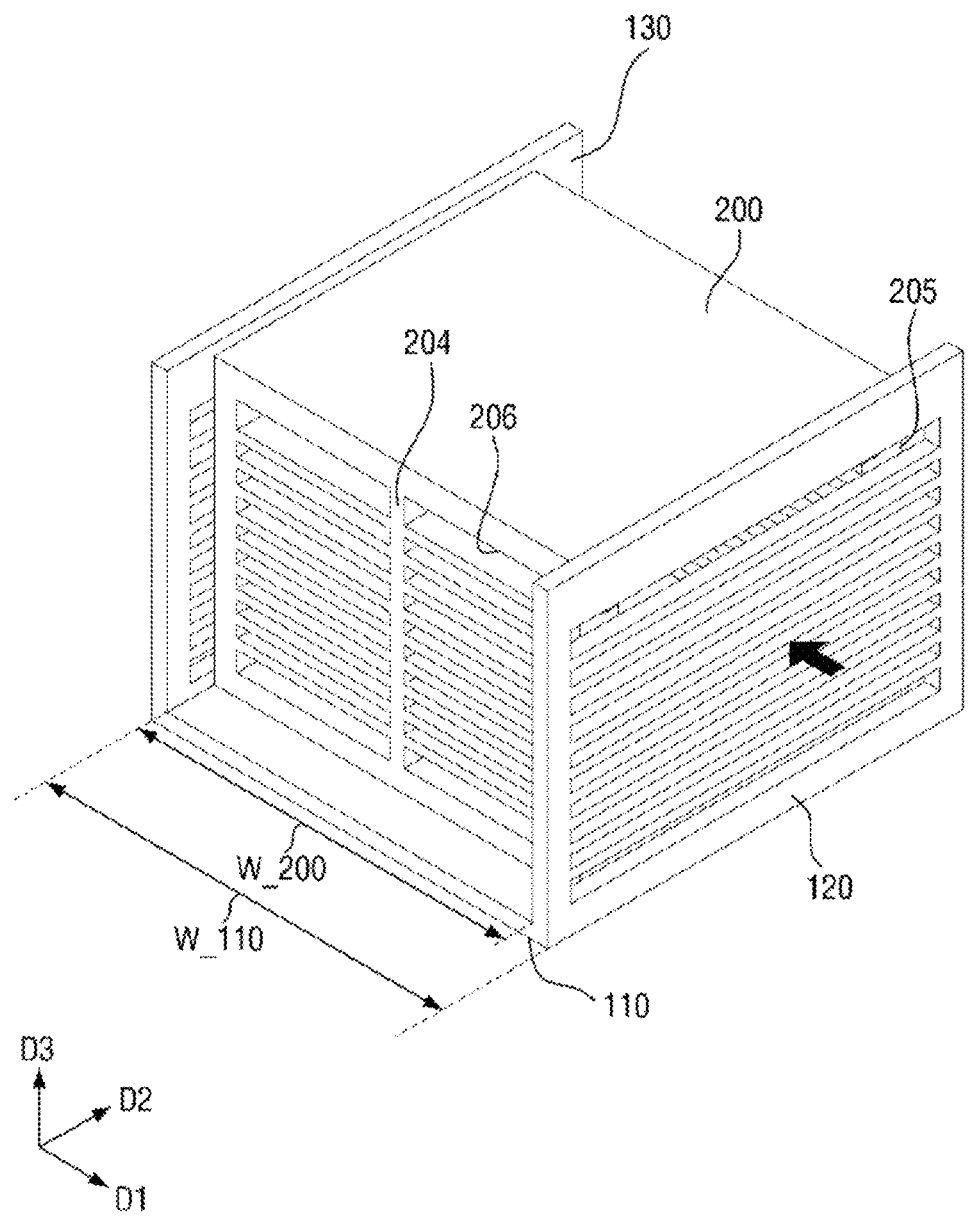
FIG. 9 is a perspective view illustrating a magazine and a magazine supporting equipment according to some other embodiments of the present disclosure.

FIG. 8 is a perspective view illustrating a magazine and a magazine supporting equipment according to some other embodiments of the present disclosure. FIG. 9 is a perspective view illustrating a magazine and a magazine supporting equipment according to some other embodiments of the present disclosure. Hereinafter, a description is made of the magazine supporting equipment according to some still other embodiments of the present disclosure with reference to FIGS. 8 and 9. The following description is mainly directed to the differences from the magazines and magazine supporting equipment shown in FIGS. 1 to 4.

Referring to FIGS. 8 and 9, the contact plate 110 may include a roller with bearings therein and a plate with grooves therein to slide the first sidewall plate 120, thereby changing the first distance W_110.

The first distance W_110 of the contact plate 110 of FIG. 8 increases with the addition of an additional distance W_add in comparison with that of the contact plate 110 of FIG. 1, i.e., the additional distance W_add between the first sidewall plate 120 and the first sidewall 201 of the magazine.

As with the contact plate 110 shown in FIG. 9, the difference between the first distance W_110 and the magazine width W_200 becomes equal to the sum of the thicknesses of the first and second sidewall plates 120 and 130 such that the first and second sidewalls 201 and 202 may respectively contact the first and second sidewall plates 120 and 130.

According to an embodiment of the present disclosure, the first distance W_110 may vary to adjust the amount of the gas flowing into the magazine 200.

Figure 10:
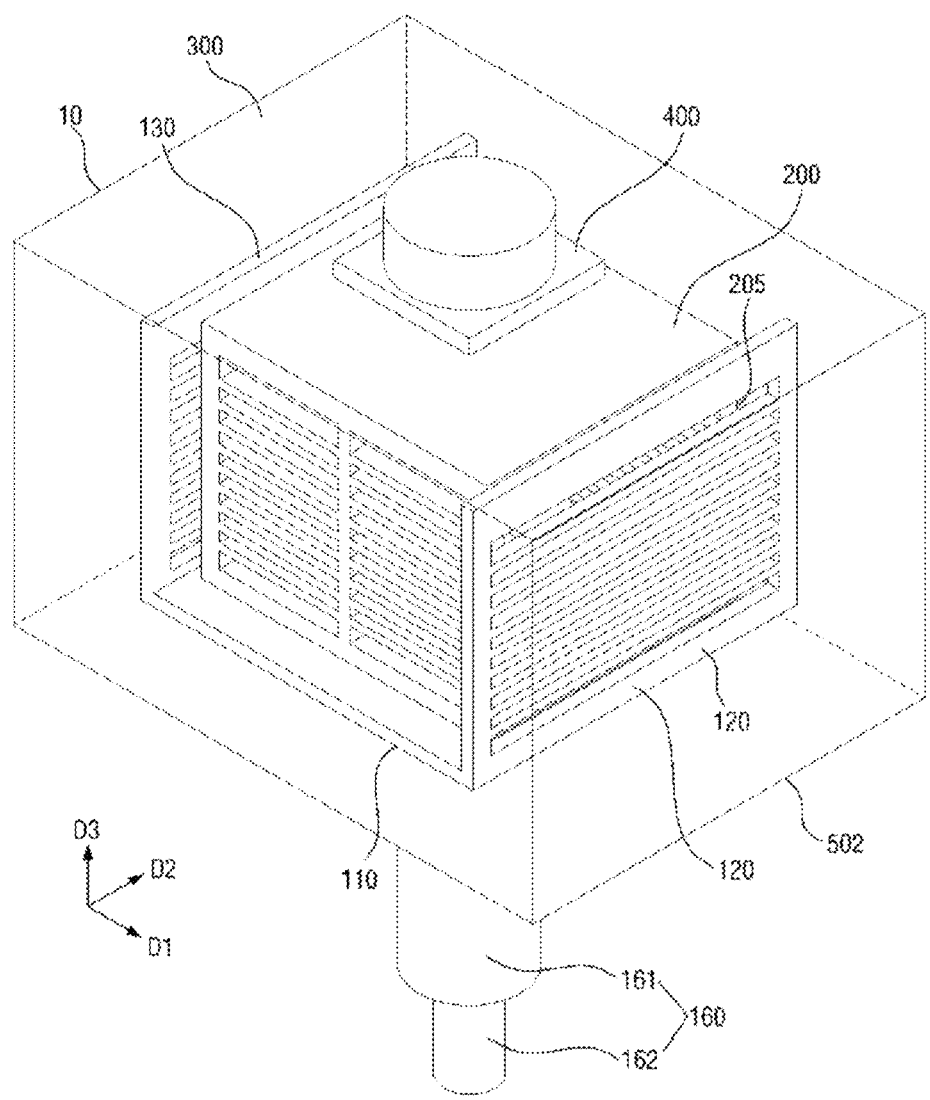
FIG. 10 is a perspective view illustrating a semiconductor manufacturing apparatus according to some embodiments of the present disclosure.

FIG. 10 is a perspective view illustrating a semiconductor manufacturing apparatus according to some embodiments of the present disclosure.

Referring to FIG. 10, a semiconductor manufacturing apparatus 10, according to some embodiments of the present disclosure, may include a magazine 200, a magazine supporting equipment 100, a chamber body 300, and a gas injection part 400.

The magazine supporting equipment 100 and the magazine 200 may correspond to the magazine supporting equipment 100 and the magazine 200 of FIGS. 1 to 4, and the following description is directed to the differences therefrom.

The magazine supporting equipment 100 may further include a rotation member 160 under the contact plate 110 in comparison with FIGS. 1 to 4.

The rotation member 160 may include a rotation driving unit 161 and a rotation block 162. The rotation driving unit 161 may be disposed under the contact plate 110 to be connected to the contact plate 110, and the rotation block 162 may be connected to the rotation driving unit 161 and arranged such that the rotation axis of the rotation block 162 coincides with the center axis of the magazine 200. The rotation member 160 may rotate the magazine 200 around the center axis of the magazine 200 during the process.

Accordingly, the rotation member 160 may support the magazine 200 and the magazine supporting equipment 100 on the chamber body 300.

The chamber body 300 may provide a space for performing a plasma process, a cleaning process, and an etching process. The chamber body 300 may be provided with a top wall, sidewalls, and a bottom wall and, although not shown in the drawing, may further be provided with a passage on one side thereof for taking in and out the magazine 200 containing substrates.

Although shown in the drawing that the chamber body 300 includes one station for performing the process, the chamber body 300 may include a plurality of stations depending on the embodiment, and the stations may each include a magazine 200, a magazine supporting equipment 100, a chamber body 300, and a gas injection part 400.

The gas injection part 400 may be arranged on top of the magazine supporting equipment 100, facing the contact plate 110, inside the chamber body 300. The gas injection part 400 may be a component connected to a gas supply unit (not shown) and configured to distribute the process gas from the gas supply unit (not shown) to the substrates inside the magazine 200. The gas injection part 400 may be, for example, a showerhead and include a plate with a plurality of spraying holes for spraying the process gas.

Figure 11:
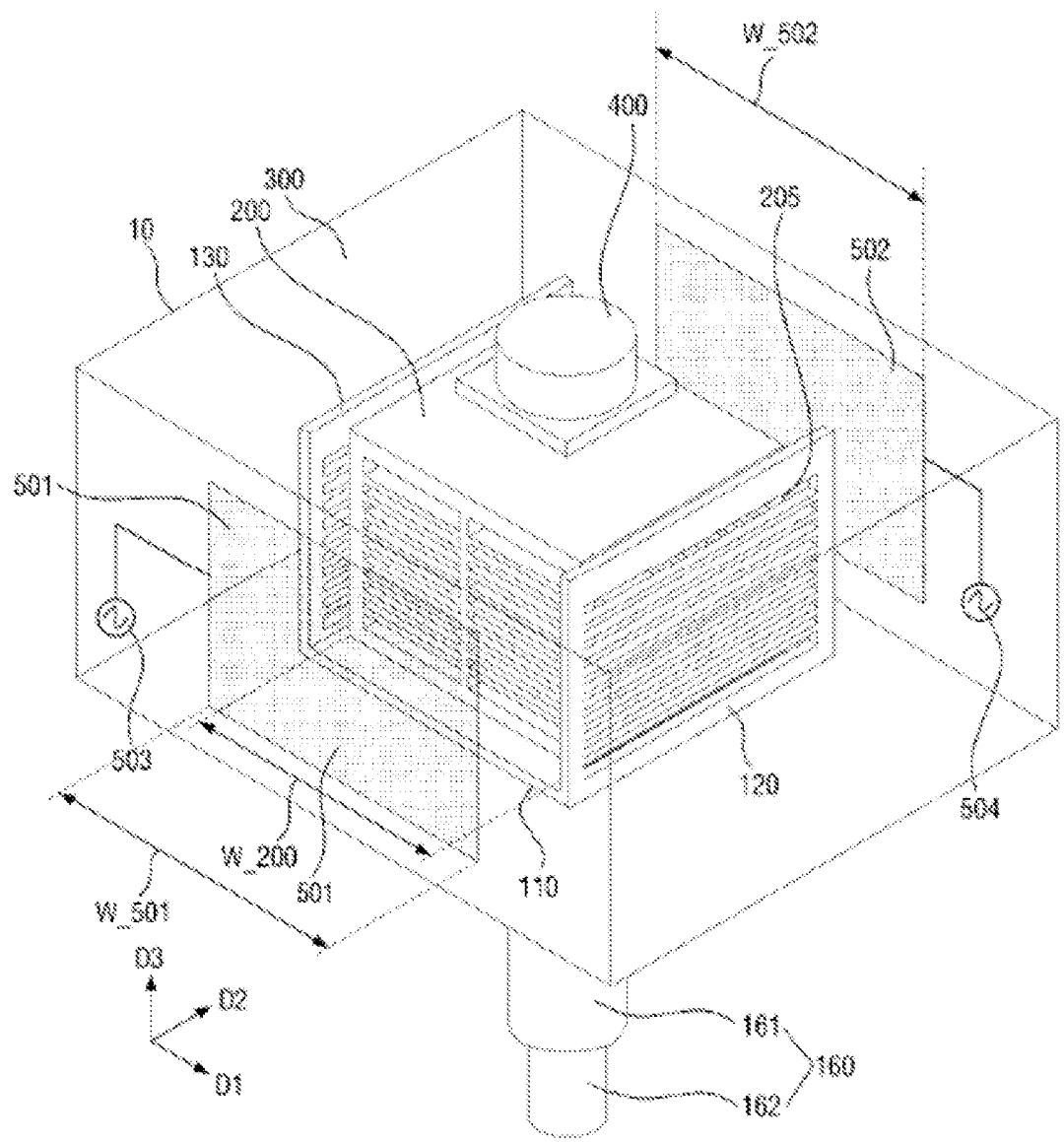
FIG. 11 is a perspective view illustrating a semiconductor manufacturing apparatus according to some other embodiments of the present disclosure.

However, in the case where no electrode is included, unlike the semiconductor manufacturing apparatus 10 of FIG. 11, the gas injection part 400 may receive the gas that has been already plasmatized or a chemical gas from the gas supply unit and inject the gas into the magazine 200 and the magazine supporting equipment 100, similar to a remote plasma injection method. The plasmatized gas or the chemical gas may include plasmatized $O_2$, without being limited thereto.

FIG. 11 is a perspective view illustrating a semiconductor manufacturing apparatus according to some other embodiments of the present disclosure. Hereinafter, a description is made of the semiconductor manufacturing apparatus according to some other embodiments of the present disclosure with reference to FIG. 11. The following description is directed to the differences from the semiconductor manufacturing apparatus shown in FIG. 10.

The semiconductor manufacturing apparatus 10 may include a first electrode 501, a second electrode 502, a first power supply source 503, and a second power supply source 504.

The first and second electrodes 501 and 502 may be arranged symmetrically about the magazine 200 and the magazine supporting equipment 100. Although shown in the drawing that the first and second electrodes 501 and 502 are arranged to respectively face the third and fourth sidewalls 204 and 205 of the magazine 200, the present disclosure is not limited thereto. Further, electrode widths W_501 and W_502 of the respective first and second electrodes 501 and 502 may each be wider than the magazine width W_200 of the magazine 200.

The first and second power supply sources 503 and 504 may supply RF power to the respective first and second electrodes 501 and 502 to generate an electric field with a voltage difference between the first and second electrodes 501 and 502. The generated electric field may convert the process gas inside the magazine 200 and the magazine supporting equipment 100 to the plasmatized gas for use in the plasma process. The gas inside the magazine 200 and the magazine supporting equipment 100 may be oxygen, without being limited thereto.

Figure 12:
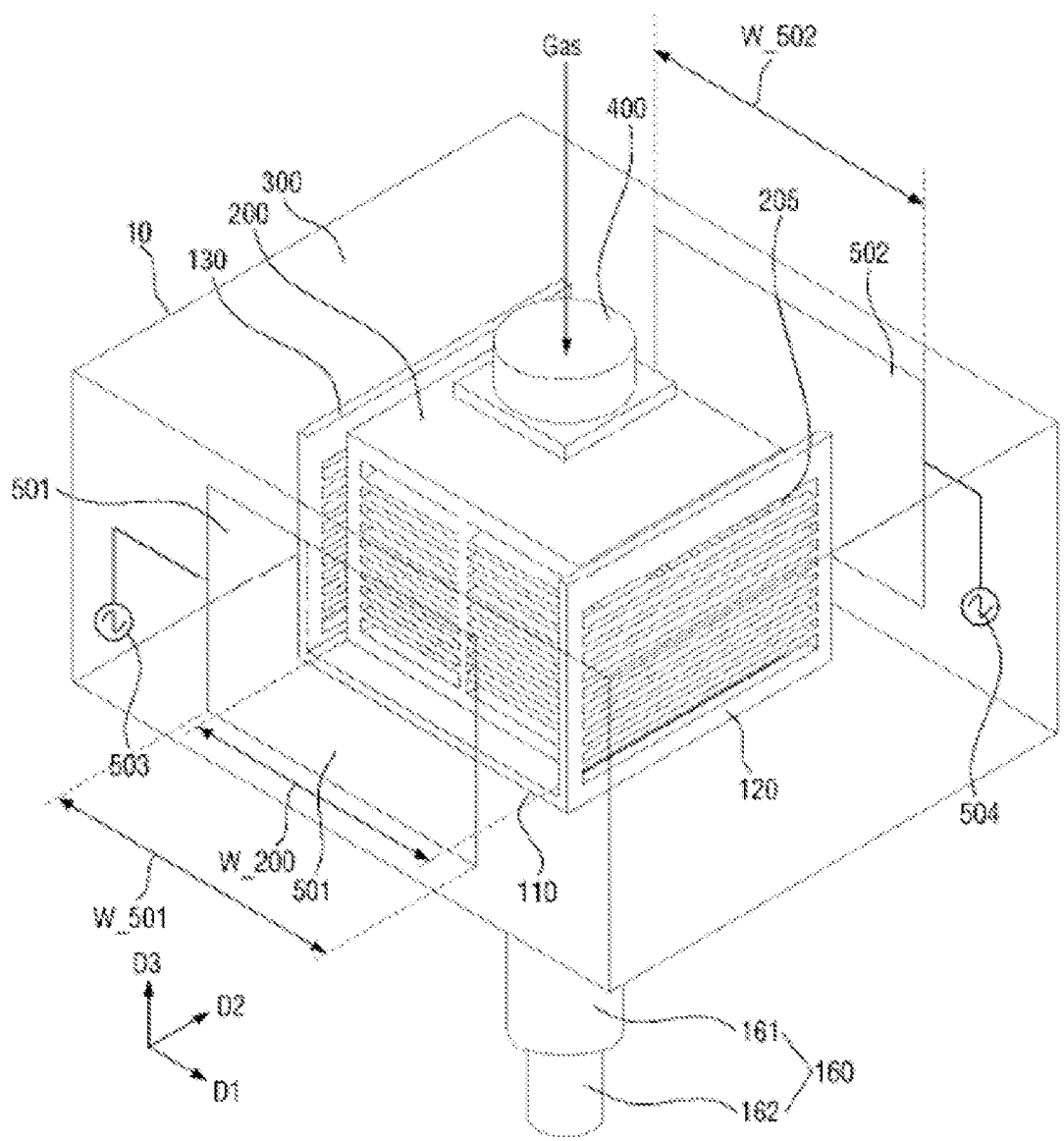
FIGS. 12 to 14 are views for explaining operations of a semiconductor manufacturing apparatus according to some embodiments of the present disclosure.
Figure 13:
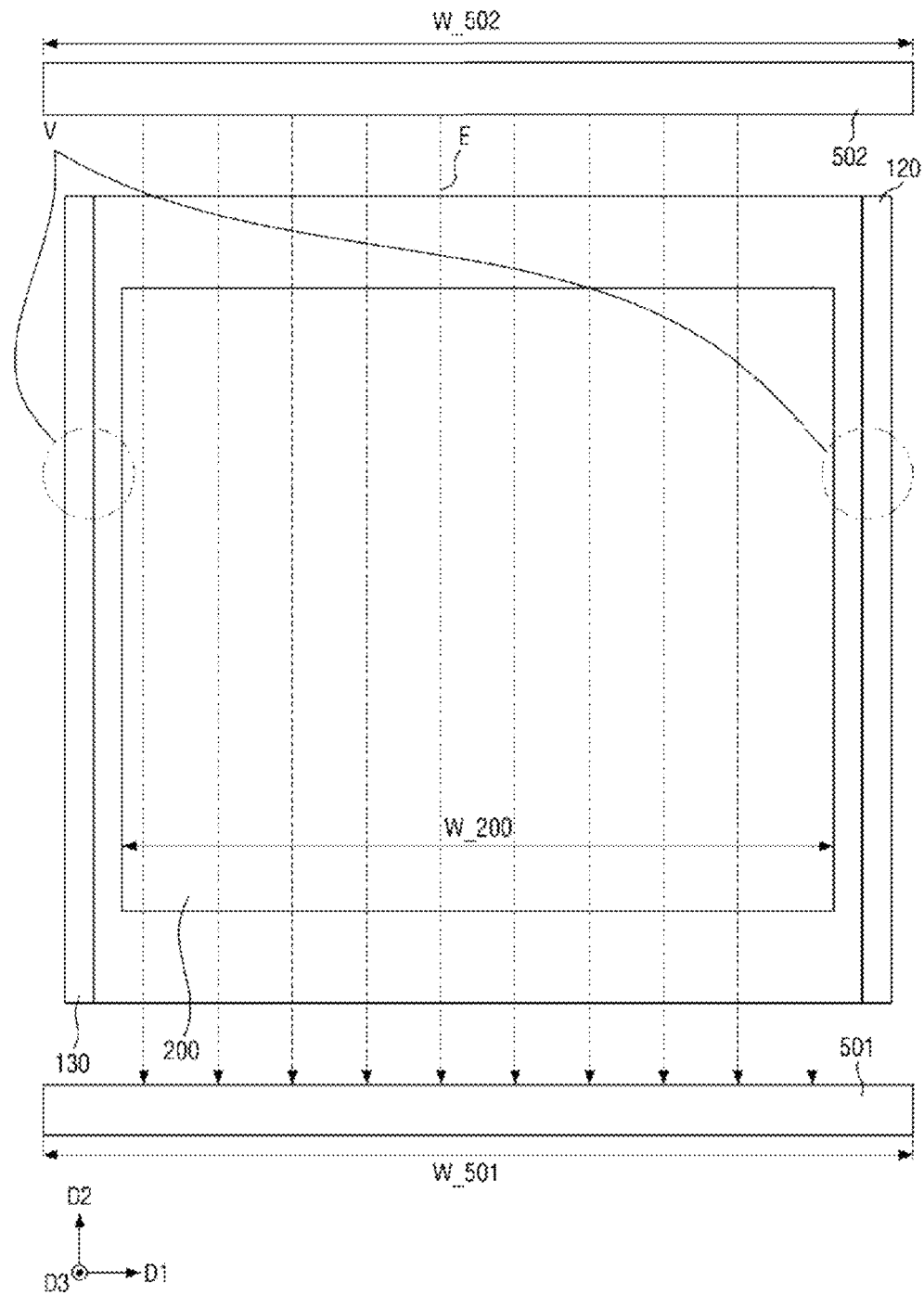
Figure 14:
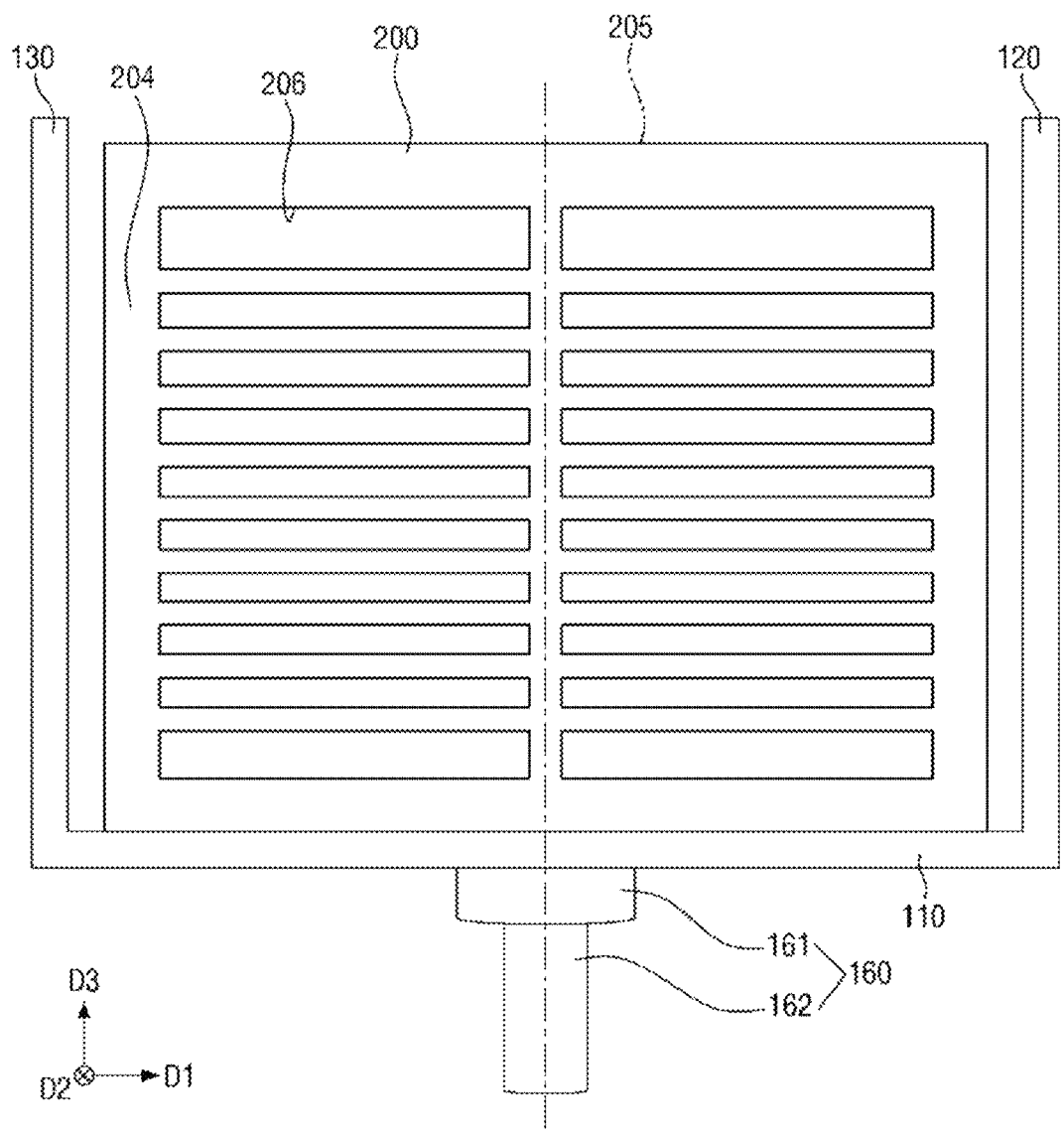

FIGS. 12 to 14 are views for explaining operations of a semiconductor manufacturing apparatus according to some embodiments of the present disclosure.

Referring to FIG. 12, the gas injection part 400 may supply the process gas into the process area where the magazine 200 and the magazine supporting equipment 100 are arranged. Then the process gas may be supplied to the substrates inside the magazine 200 in which the process is in progress.

Referring to FIG. 13, the first and second power supply sources 503 and 504 may supply RF powers to the respective first and second electrodes 501 and 502 to generate an electric field with the voltage difference between the first and second electrodes 501 and 502, i.e., a process electric field E from the second electrode 502 to the first electrode 501.

The process gas supplied into the magazine 200 may be plasmatized by the process electric field E. The first and second sidewall plates 120 and 130 of the magazine supporting equipment 100 may be arranged on the magazine 200 to prevent the process electric field E from being concentrated in an empty space V that may be produced at both sides of the magazine 200.

Accordingly, even though the position is changed in the direction D1 within the magazine 200, the process electric field E may be maintained uniformly. As a result, the plasmatized process gas may remain at a uniform concentration in the magazine 200.

Referring to FIG. 14, the gas injection part 400 may inject the process gas, and the rotation member 160 may rotate the magazine 200 and the magazine supporting equipment 100 around the center axis of the magazine 200 in a turn plasma method while the first and second power supply sources 503 and 504 supply the RF powers to the respective first and second electrodes 501 and 502.

According to an embodiment, the rotation member 160 may serve as a supporting table in a direct plasma method so as not to rotate the magazine 200 and the magazine supporting equipment 100 during the plasma process.

FIGS. 15 and 16 are diagrams for explaining the effects of a semiconductor manufacturing apparatus according to some embodiments of the present disclosure.

Referring to FIGS. 15 and 16, the first substrate 1_1 may include regions A1 to A6, B1 to B6, I1 to I6, J1 to J6, Q1 to Q6, and R1 to R6 arranged in the first direction D1 according to the positions where the process has performed. FIG. 16 is a graph illustrating gray values (G/V) representing etching extents according to the respective regions.

As the etching progresses on the substrate, a filler may be exposed such that the G/V tends to decrease. Accordingly, in the case where two different regions of the first substrate 1_1 are similar in G/V to each other, the two regions may be considered to be etched to similar extents.

Referring to FIG. 16, in the case of performing the plasma process by applying the magazine supporting equipment 100 of the present disclosure, the G/V of about 180 was uniformly maintained from one outer-most region A1 to another outer-most region R6 across the center region I6, which means that the etching rate is uniform within the first substrate 1_1.

In the case where the plasma process is performed without applying the magazine supporting equipment 100 of the present disclosure, the G/V is in the range of about 80 to 90 in the outer-most regions A1 and R6 and about 170 in the center region I6. Therefore, a difference diff_A1_I6 in G/V between the regions A1 and I6 is equal to or greater than about 80, which may mean that the difference in etching rate between the center and outer-most regions is great.

The magazine supporting equipment 100, according to some embodiments of the present disclosure, is capable of improving process reliability and efficiency. This is performed by uniformizing the density of plasmatized process gas inside the magazine 200 by adjusting the electric field on the sidewalls of the magazine 200 with the sidewall plates 120 and 130, the control openings formed in the sidewall plates 120 and 130, and the like.

The electric field crossing the magazine 200 may be adjusted by adjusting the space between the sidewall plates 120 and 130 and the number, arrangement, and size of the control openings in the sidewall plates 120 and 130.

However, the effects of the embodiments are not restricted to the one set forth herein. The above and other effects of the embodiments will become more apparent to one of daily skill in the art to which the present disclosure pertains by referencing the claims.

What is claimed is:

1. A semiconductor manufacturing apparatus comprising:
   a magazine including N input ports;
   a magazine supporting equipment configured to support the magazine; and
   a gas injection part configured to inject etching gas into the magazine and the magazine supporting equipment, wherein the gas injection part is separated from the magazine in a first direction,
   wherein the magazine supporting equipment includes:
      a contact plate in contact with the magazine;
      a first sidewall plate extending vertically from one end of the contact plate; and
      a second sidewall plate parallel to the first sidewall plate, and extending vertically from another end of the contact plate, wherein the first sidewall plate, the magazine, and the second sidewall plate are separated from each other in a second direction perpendicular to the first direction,
   wherein the first sidewall plate extends along at least a part of a first sidewall of the magazine,
      the second sidewall plate extends along at least a part of a second sidewall of the magazine,
      the first sidewall plate and the second sidewall plate include control openings through which gas flows in and out, and
      the N is a natural number of 2 or more.

2. The semiconductor manufacturing apparatus of claim 1, wherein the magazine and the magazine supporting equipment are mechanically connected.

3. The semiconductor manufacturing apparatus of claim 2, wherein the magazine moves in a direction perpendicular to the contact plate.

4. The semiconductor manufacturing apparatus of claim 1, wherein a distance between the first sidewall plate and the second sidewall plate is changed by changing a width between the one end and the other end of the contact plate.

5. The semiconductor manufacturing apparatus of claim 1, further comprising:
   a rotation block configured to rotate the magazine around a center axis of the magazine.

6. The semiconductor manufacturing apparatus of claim 1, further comprising:
   first and second electrodes disposed symmetrically about the magazine and the magazine supporting equipment, and facing each other,
   wherein the first electrode and the second electrode apply a voltage to the etching gas for plasmatization.

7. The semiconductor manufacturing apparatus of claim 1, wherein each of the first sidewall plate and the second sidewall plate includes M control openings, and
   the M is a natural number of 1 or more.

8. The semiconductor manufacturing apparatus of claim 7, wherein the magazine further includes a bottom space under a bottom-most input port among the N input ports, and
   the M is 1 greater than the N.

9. The magazine supporting equipment of claim 1, wherein the first sidewall plate entirely covers the first sidewall, and the second sidewall plate entirely covers the second sidewall.

10. A semiconductor manufacturing apparatus comprising:
- a magazine including N input ports and a bottom space under a bottom-most input port among the N input ports;
- a magazine supporting equipment configured to support the magazine; and
- a gas injection part configured to inject an etching gas into the magazine and the magazine supporting equipment, wherein the gas injection part is separated from the magazine in a first direction,
- wherein the magazine supporting equipment includes:
- a contact plate in contact with the magazine;
- a first sidewall plate extending vertically from one end of the contact plate; and
- a second sidewall plate parallel to the first sidewall plate, and extending vertically from another end of the contact plate, wherein the first sidewall plate, the magazine, and the second sidewall plate are separated from each other in a second direction perpendicular to the first direction,
- wherein the first sidewall plate extends along at least a part of a first sidewall of the magazine,
- the second sidewall plate extends along at least a part of a second sidewall of the magazine,
- the first sidewall plate and the second sidewall plate include N+1 control openings through which the etching gas flows in and out, the N+1 control openings overlap the N input ports and the bottom space, respectively, in a plan view of a plane parallel to the first sidewall plate and the second sidewall plate, and
- the N is a natural number of 2 or more.

11. The semiconductor manufacturing apparatus of claim 10, wherein the N input ports are arranged vertically with respect to the contact plate in an order from a first input port disposed at a highest position from the contact plate to an $N^{th}$ input port disposed at a lowest position from the contact plate,
- the N+1 control openings are arranged vertically with respect to the contact plate in the order from a first control opening disposed at a highest position from the contact plate to an $(N+1)^{th}$ control opening disposed at a lowest position from the contact plate, and
- respective centers of the first to $N^{th}$ input ports and the bottom space are identical, in height from the contact plate, to respective centers of the first to $(N+1)^{th}$ control openings.

12. The semiconductor manufacturing apparatus of claim 11, wherein respective vertical widths of the first to $(N+1)^{th}$ control openings are identical to respective vertical widths of the first to $N^{th}$ input ports and the bottom space.

13. A semiconductor manufacturing apparatus comprising:
- a magazine including N input ports;
- a magazine supporting equipment configured to support the magazine; and
- a gas injection part configured to inject etching gas into the magazine and the magazine supporting equipment,
- first and second electrodes arranged symmetrically about the magazine and the magazine supporting equipment in a first direction, and facing each other,
- wherein the first electrode and the second electrode apply a voltage to the etching gas for plasmatization,
- wherein the magazine supporting equipment includes:
- a contact plate in contact with the magazine;
- a first sidewall plate extending vertically from one end of the contact plate; and
- a second sidewall plate parallel to the first sidewall plate, and extending vertically from another end of the contact plate, wherein the first sidewall plate, the magazine, and the second sidewall plate are spaced apart from each other in a second direction perpendicular to the first direction,
- wherein the first sidewall plate extends along at least a part of a first sidewall of the magazine,
- the second sidewall plate extends along at least a part of a second sidewall of the magazine,
- the first sidewall plate and the second sidewall plate include control openings through which gas flows in and out, and
- the N is a natural number of 2 or more.

* * * * *